(12) United States Patent
Cho et al.

(10) Patent No.: US 9,129,972 B2
(45) Date of Patent: Sep. 8, 2015

(54) SEMICONDUCTOR PACKAGE

(75) Inventors: Young-sang Cho, Yongin-si (KR);
Dong-han Kim, Osan-si (KR); Dae-woo Son, Cheonan-si (KR); Ye-chung Chung, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 307 days.

(21) Appl. No.: 12/458,231

(22) Filed: Jul. 6, 2009

(65) Prior Publication Data

US 2010/0001392 A1 Jan. 7, 2010

(30) Foreign Application Priority Data

Jul. 4, 2008 (KR) ........................ 10-2008-0065140

(51) Int. Cl.
*H01L 23/544* (2006.01)
*H01L 23/48* (2006.01)
*H01L 23/498* (2006.01)
*H01L 23/00* (2006.01)

(52) U.S. Cl.
CPC ............ *H01L 23/544* (2013.01); *H01L 23/498* (2013.01); *H01L 24/81* (2013.01); *H01L 2223/5442* (2013.01); *H01L 2223/5448* (2013.01); *H01L 2223/54426* (2013.01); *H01L 2223/54473* (2013.01); *H01L 2224/81121* (2013.01); *H01L 2224/81801* (2013.01); *H01L 2924/01006* (2013.01); *H01L 2924/01013* (2013.01); *H01L 2924/01029* (2013.01); *H01L 2924/01033* (2013.01); *H01L 2924/01047* (2013.01); *H01L 2924/01082* (2013.01)

(58) Field of Classification Search
CPC .......... H01L 2223/54426; H01L 2224/81121; H01L 23/544; H01L 24/86; H01L 25/0657; H01L 2223/5448; H01L 2224/8112; H01L 2224/81136
USPC .......... 257/690, 692, E23.023, E23.179, 797, 257/773, 786, 778; 438/117
See application file for complete search history.

(56) References Cited

U.S. PATENT DOCUMENTS

| | | | | |
|---|---|---|---|---|
| 6,141,082 | A * | 10/2000 | Nara et al. | 355/53 |
| 7,019,223 | B2 * | 3/2006 | Rumsey et al. | 174/261 |
| 2007/0069363 | A1 * | 3/2007 | Kawabata et al. | 257/698 |

(Continued)

FOREIGN PATENT DOCUMENTS

| | | |
|---|---|---|
| JP | 2003-31623 | 1/2003 |
| JP | 2003-179091 | 6/2003 |

(Continued)

OTHER PUBLICATIONS

Korean Office Action dated May 19, 2014 for corresponding Korean Application No. 10-2008-0065140.

(Continued)

*Primary Examiner* — Nitin Parekh
(74) *Attorney, Agent, or Firm* — Harness, Dickey & Pierce, P.L.C.

(57) ABSTRACT

Provided is a semiconductor package including a substrate and a semiconductor chip formed on the substrate. The semiconductor chip may include a chip alignment mark on a surface of the semiconductor chip, and wiring patterns formed on a surface of the substrate, wherein the chip alignment mark is bonded to the wiring patterns. Accordingly, the surface area of the semiconductor chip may be reduced.

20 Claims, 12 Drawing Sheets

(56) References Cited

U.S. PATENT DOCUMENTS

| | | | |
|---|---|---|---|
| 2007/0176320 A1* | 8/2007 | Nakamura et al. | 264/219 |
| 2007/0262454 A1* | 11/2007 | Shibata | 257/758 |
| 2008/0073782 A1* | 3/2008 | Shin et al. | 257/737 |

FOREIGN PATENT DOCUMENTS

| | | |
|---|---|---|
| JP | 2003-324123 | 11/2003 |
| JP | 2004-77386 | 3/2004 |
| JP | 2005-311250 A | 11/2005 |
| KR | 20070036007 A | 4/2007 |
| KR | 10-0809704 B1 | 3/2008 |

OTHER PUBLICATIONS

Korean Office Action dated Nov. 27, 2014 for corresponding Korean Application No. 10-2008-0065140.

* cited by examiner

SEMICONDUCTOR PACKAGE

CROSS-REFERENCE TO RELATED APPLICATIONS

This application claims priority under 35 U.S.C. §119 to Korean Patent Application No. 10-2008-0065140, filed on Jul. 4, 2008, in the Korean Intellectual Property Office (KIPO), the entire contents of which are herein incorporated by reference.

BACKGROUND

1. Field

Example embodiments relate to a semiconductor package, and more particularly, to a semiconductor package including a semiconductor chip on which a chip alignment mark may be formed.

2. Description of the Related Art

Various semiconductor package structures have been suggested for realizing a highly precise and compact semiconductor package. Particularly, research is focusing on a stacked package structure in which bumps formed on a surface of a semiconductor chip are bonded to wiring patterns formed on a surface of a substrate.

FIG. 1 is a plan view illustrating the structure of a semiconductor chip 11 of a conventional semiconductor package, and FIG. 2 is a plan view illustrating a substrate 21 of a conventional semiconductor package. FIG. 3 is a plan view illustrating the semiconductor chip 11 stacked on the substrate 21 of the conventional semiconductor package.

FIG. 1 illustrates a portion of the semiconductor chip 11 of a conventional semiconductor package. As shown in FIG. 1, a semiconductor chip 11 may include a plurality of bumps 12a and 12b disposed on the outer regions of the semiconductor chip 11. The semiconductor chip 11 may also include a chip alignment mark 15 to precisely dispose the semiconductor chip 11 on the substrate in a correct position. The chip alignment mark 15 may also be surrounded by an auxiliary line 14.

The bumps 12b may be dummy bumps which do not electrically connect the semiconductor chip 11 to the substrate 21. The bumps 12a, however, may electrically connect the semiconductor chip 11 to the substrate 21. Routing wirings may be formed on the semiconductor chip 11, which may extend toward a center of the semiconductor chip 11. The routing wirings may be formed to electrically connect the bumps 12a to a semiconductor device (not shown). The bumps 12a and 12b and the chip alignment mark 15 may be formed on a lower surface of the semiconductor chip 11, thus, the bumps 12a and 12b and the chip alignment mark 15 are illustrated by a dotted line in FIG. 1.

Referring to FIG. 2, a plurality of wiring patterns 22a and 22b and a substrate alignment mark 25 may be formed on a surface of a substrate 21. The wiring patterns 22a may electrically connect the substrate 21 to the semiconductor chip 11, and the wiring patterns 22b may be dummy wiring patterns which are not related to the electrical connection. The substrate alignment mark 25 may be used to precisely arrange the semiconductor chip 11 in a correct position on the substrate 21.

Referring to FIG. 3, the semiconductor chip 11 may be arranged on the substrate 21, thereby forming a semiconductor package. Because the bumps 12a and 12b and the chip alignment mark 15 formed on the surface of the semiconductor chip 11 may be formed on a lower surface of the semiconductor chip 11, the bumps 12a and 12b and the alignment mark 15 are illustrated by a dotted lines in FIG. 3.

FIG. 4 is a cross-sectional view of a portion of the semiconductor package of FIG. 3 cut along a line IV-IV'. Referring to FIG. 4, the bumps 12a and 12b on the lower surface of the semiconductor chip 11 may be bonded to the wiring patterns 22a and 22b on the substrate 21. The semiconductor chip 11 and the substrate 21 may be electrically connected to each other by way of the bonding the bumps 12a to the wiring patterns 22a. The dummy bumps 12b may be bonded to the dummy wiring patterns 22b that may be formed on the surface of the substrate 21. The bonding between the dummy bumps 12b and the wiring patterns 22b may not electrically connect the semiconductor chip 11 to the substrate 21 but may reinforce the physical connection between the semiconductor chip 11 and the substrate 21.

Referring to FIG. 3, the chip alignment mark 15 is not disposed at the outer corner of the semiconductor chip 11 due to the presence of the dummy bumps 12b but is disposed in a portion of the semiconductor chip 11 which is interior to the bumps 12a and 12b. Accordingly, providing space for the routing wiring 13 may be difficult due to the chip alignment mark 15. Accordingly, the size of the semiconductor chip 11 may be required to be undesirably increased.

SUMMARY

Example embodiments provide a semiconductor package including a semiconductor chip with a chip alignment mark and dummy bumps as one single unit. Accordingly, a semiconductor package, according to example embodiments, may have a reduced size.

In accordance with example embodiments, a semiconductor package may include a substrate and a semiconductor chip on the substrate, wherein the semiconductor chip includes a chip alignment mark on a surface of the semiconductor chip, the substrate includes wiring patterns on a surface of the substrate, and the chip alignment mark is bonded to the wiring patterns.

According to example embodiments, there is provided a semiconductor package including a substrate and a semiconductor chip disposed on the substrate. A chip alignment mark may be formed on a surface of the semiconductor chip, wiring patterns may be formed on a surface of the substrate, and the chip alignment mark may be bonded to the wiring patterns.

The semiconductor chip may further include bumps and routing wirings electrically connected to the bumps and extending toward a center portion of the semiconductor chip, which may be formed on a surface of the semiconductor chip, and the chip alignment mark may be disposed at an outer corner of the semiconductor chip.

The chip alignment mark may be formed of two linear strips, wherein first ends of the two linear strips meet each other perpendicularly. The second ends of the two linear strips may be directed towards outer edges of the semiconductor chip. The two linear strips may be respectively bonded to the wiring patterns, and the wiring patterns, to which the two linear strips are bonded, may act as a substrate alignment mark.

The chip alignment mark may be formed of two linear strips, and the two linear strips may be arranged to perpendicularly cross each other at center portions thereof.

The semiconductor package may be a tape automated bonding (TAB) package, and the wiring patterns may be lead line patterns formed on the substrate. The chip alignment mark and the wiring patterns may be bonded to each other by directly contacting each other or using an adhesive layer therebetween.

BRIEF DESCRIPTION OF THE DRAWINGS

Example embodiments will be more clearly understood from the following detailed description taken in conjunction with the accompanying drawings.

DETAILED DESCRIPTION

Figure 1:
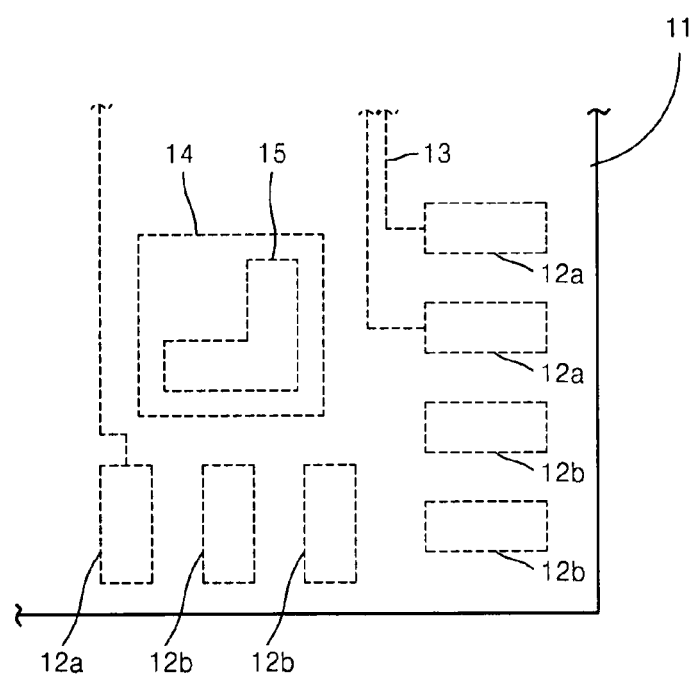
FIG. 1 is a plan view illustrating the structure of a semiconductor chip included in a conventional semiconductor package.
Figure 2:
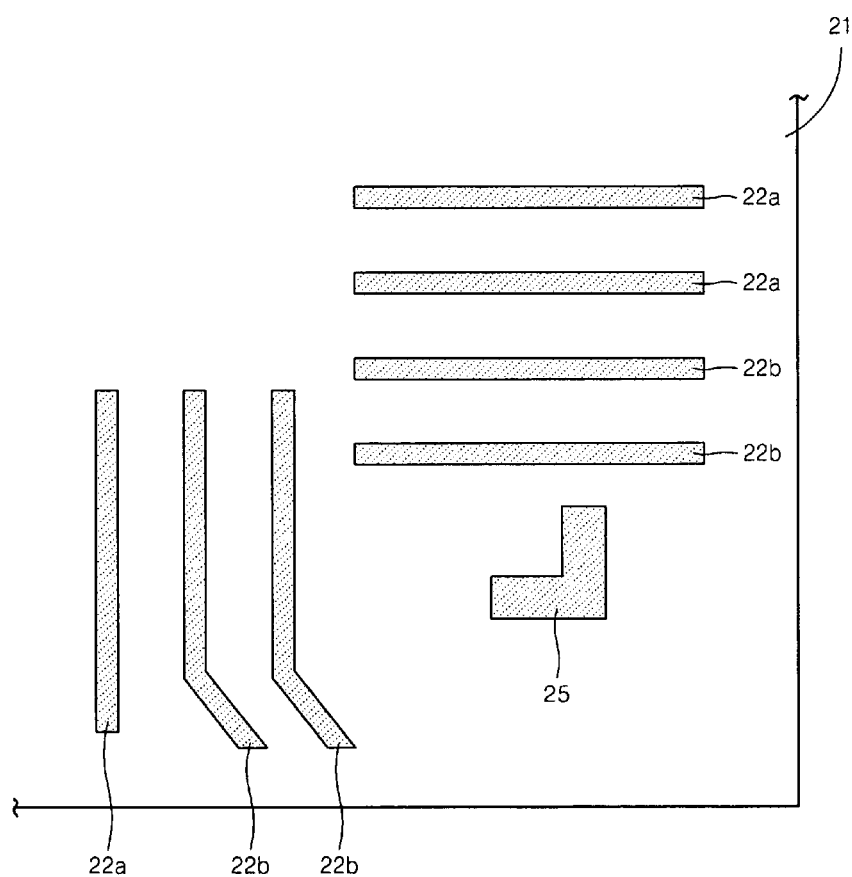
FIG. 2 is a plan view illustrating a substrate of a conventional semiconductor package.
Figure 3:
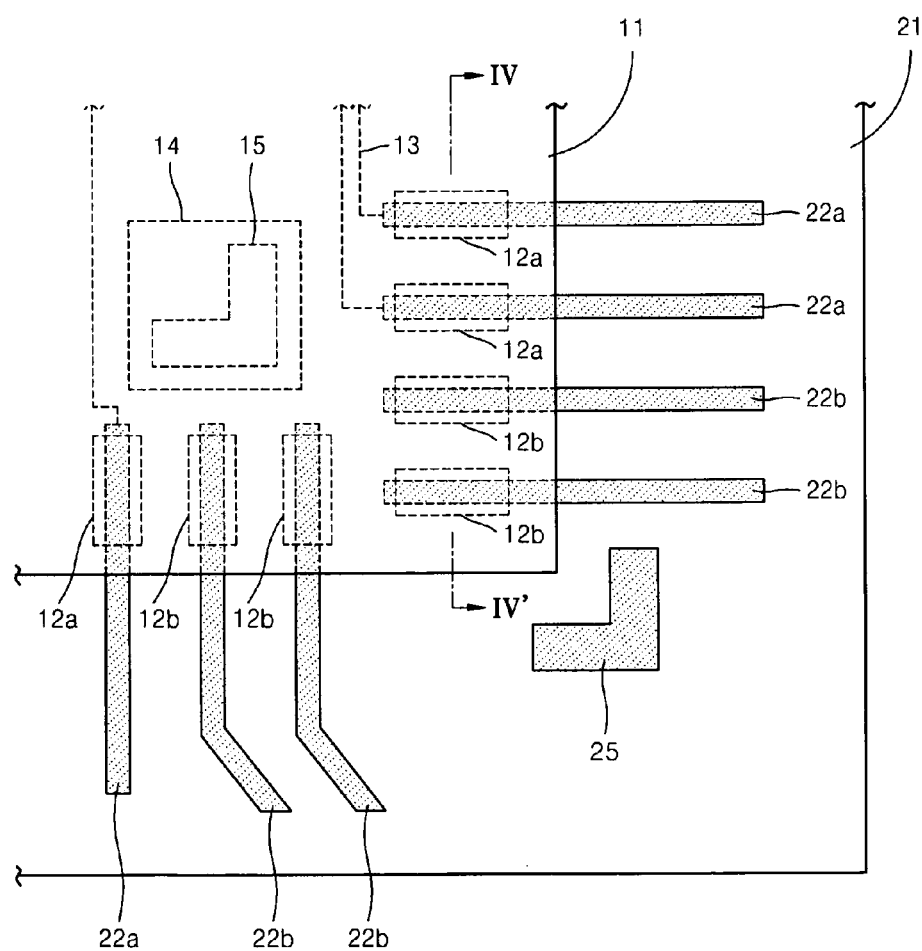
FIG. 3 is a plan view illustrating the semiconductor chip stacked on the substrate of the conventional semiconductor package.
Figure 4:
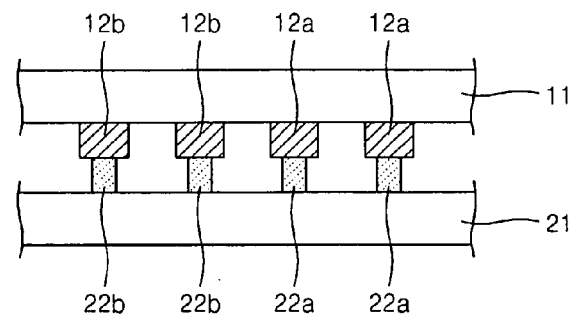
FIG. 4 is a cross-sectional view of a portion of the semiconductor package of FIG. 3 cut along a line IV-IV'.

Example embodiments will now be described more fully with reference to the accompanying drawings. Example embodiments may, however, be embodied in many different forms and should not be construed as being limited to the embodiments set forth herein; rather, example embodiments are provided so that this disclosure will be thorough and complete, and will fully convey the inventive concept to those skilled in the art. In the drawings, the thicknesses of layers and regions are exaggerated for clarity.

It will be understood that when a component, for example, a layer, a region, or a substrate is referred to as being "on", "connected to", or "coupled to" another component throughout the specification, it can be directly "on", "connected to", or "coupled to" the other component, or intervening layers that may be present. On the other hand, when a component is referred to as being "directly on", "directly connected to", or "directly coupled to" another component, it will be understood that no intervening layer is present. Like reference numerals denote like elements. As used in the present specification, the term "and/or" includes one of listed, corresponding items or combinations of at least one item.

In the present description, terms such as 'first', 'second', etc. are used to describe various members, components, regions, layers, and/or portions. However, it is obvious that the members, components, regions, layers, and/or portions should not be defined by these terms. The terms are used only for distinguishing one member, component, region, layer, or portion from another member, component, region, layer, or portion. Thus, a first member, component, region, layer, or portion which will be described may also refer to a second member, component, region, layer, or portion, without departing from the teaching of the present general inventive concept.

Relative terms, such as "under," "lower," "bottom," "on," "upper," and/or "top", may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "upper" side of other elements would then be oriented on "lower" sides of the other elements. The exemplary term "upper", can therefore, encompass both an orientation of "lower" and "upper", depending of the particular orientation of the figure.

The terminology used herein is for the purpose of describing example embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Figure 5:
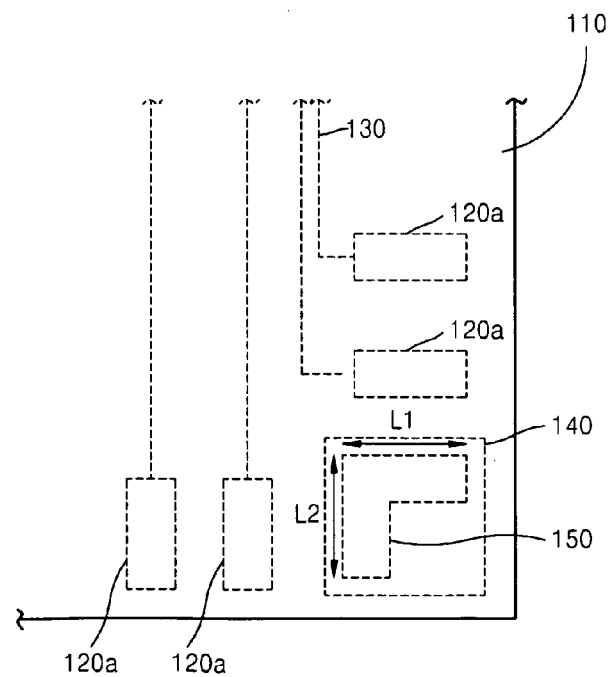
FIG. 5 is a plan view illustrating a semiconductor chip of a semiconductor package according to example embodiments.

FIG. 5 is a plan view illustrating a semiconductor chip 110 of a semiconductor package according to example embodiments. Referring to FIG. 5, a portion of a semiconductor chip 110 which may form a semiconductor package is illustrated. A plurality of bumps 120a may be formed at predetermined or preset intervals on outer regions on a surface of the semiconductor chip 110, for example, on a lower surface of the semiconductor chip 110. The bumps 120a may electrically connect the semiconductor chip 110 to a substrate 210 (see FIG. 11).

A semiconductor device (not shown) may be formed inside the semiconductor chip 110. Routing wirings 130 may be formed on the surface of the semiconductor chip 110 to electrically connect the semiconductor device to the bumps 120a. The routing wirings 130 may extend toward a center portion of the semiconductor chip 110. The extending of the routing wirings 130 to the center portion of the semiconductor chip 110 means that the routing wirings 130 do not extend to portions of the semiconductor chip 110 outside of the bumps 120a.

In order to precisely arrange the semiconductor chip 110 in a correct position on the substrate 210, a chip alignment mark 150 may be formed on a surface of the semiconductor chip 110. The chip alignment mark 150 may be disposed at an outer corner of the semiconductor chip 110. As shown in FIG. 5, the chip alignment mark 150 may be disposed so that it is not between the bumps 120a and the center portion of the semiconductor chip 110. The chip alignment mark 150 may be surrounded by an auxiliary line 140.

Because the chip alignment mark 150 may be arranged at the outer corner of the semiconductor chip 110, the routing wirings 130 may extend from the bumps 120a and may be arranged in a desired pattern. Because the routing wirings 130 may be arranged without having to avoid the chip alignment mark 150, the length of the routing wirings 130 may be minimized or reduced. Accordingly, the wiring resistance may be minimized or reduced, and the manufacturing costs of the semiconductor package may be reduced.

Referring to FIG. 5, the chip alignment mark 150 may be formed of two linear strips. The two linear strips may be disposed such that first ends thereof meet each other and are perpendicular to each other. The two linear strips may be disposed such that their other ends (second ends) are directed towards outer edges of the semiconductor chip 110. For example, a first linear strip may have a first length L1, and a second linear strip may have a second length L2, so that proximal ends (the first ends facing towards the semiconductor chip 110) are perpendicular to each other, and the distal ends (second ends facing the edges of the semiconductor chip 110) are directed towards outer edges of the semiconductor chip 110, thereby forming an L-shape.

The bumps 120a and the chip alignment mark 150 may be formed on a lower surface of the semiconductor chip 110, accordingly, the bumps 120a and the alignment mark 150 are illustrated with dotted lines.

Figure 6:
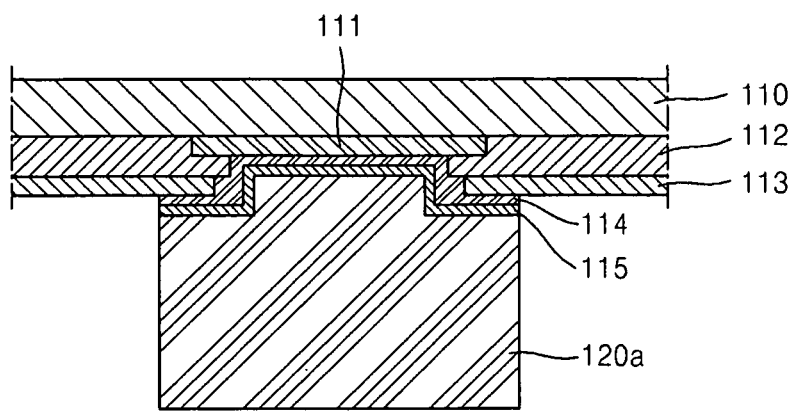
FIG. 6 is a cross-sectional view of a bump formed on a semiconductor chip of a semiconductor package according to example embodiments.

FIG. 6 is a cross-sectional view of a bump 120a formed on a semiconductor chip of a semiconductor package according to example embodiments. Referring to FIG. 6, a semiconductor chip 110 may include an electrode pad 111 on its upper surface. The electrode pad 111 may be formed of aluminum. A first protection layer 112 and/or a second protection layer 113 may be further formed having an opening to expose the electrode pad 111. Each of the first and second protection layers 112 and 113 may be formed of an oxide layer and/or a nitride layer.

Intermediate contact layers 114 and 115 may be formed of titanium and/or copper and may be interposed between the electrode pad 111 and the bump 120a. The first intermediate contact layer 114 may be formed of titanium, and the second intermediate contact layer 115 may be formed of copper, but example embodiments are not limited thereto.

The bump 120a may be formed by arranging a mask pattern having an opening at the position of the electrode pad 111, and then filling the opening, which may be defined by an interior surface of the mask pattern, with a conductive, first material. For example, the first material may include copper, and a copper bump 120a may be formed by electroplating or electroless-plating. However, the copper bump 120a may also be formed using a well-known metal layer formation method, for example, a physical or chemical vapor deposition method, instead of plating. The copper bump 120a may be cylinder-shaped.

These are examples of the structure and material of a bump, and example embodiments are not limited thereto.

Figure 7:
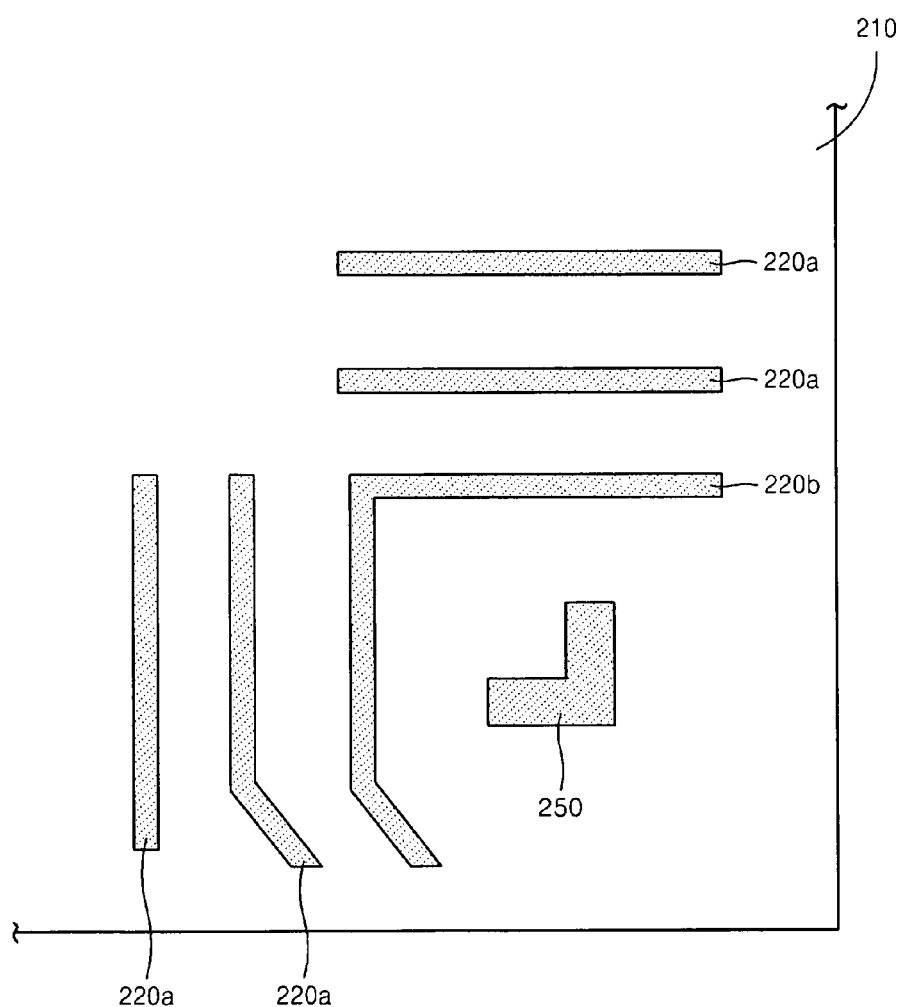
FIG. 7 is a plan view illustrating a portion of a substrate of a semiconductor package according to example embodiments.

FIG. 7 is a plan view illustrating a portion of a substrate 210 of a semiconductor package according to example embodiments. Referring to FIG. 7, a plurality of wiring patterns 220a and 220b may be formed on a surface of the substrate 210, for example, on an upper surface. The wiring patterns 220a may electrically connect the substrate 210 to the semiconductor chip 110, and the wiring patterns 220b may be dummy wiring patterns which are not related to the electrical connection. A chip alignment mark 150 may be bonded to the dummy wiring pattern 220b, and thus, the shape of the dummy wiring pattern 220b could correspond to that of the chip alignment mark 150. For example, if the chip alignment mark 150 is formed of two linear strips arranged in an L shape, dummy wiring patterns 220b corresponding to the chip alignment mark 150 may also be L-shaped.

In order to precisely arrange the semiconductor chip in the correct position on the substrate 210, a substrate alignment mark 250 may be formed on a surface of the substrate 210.

The semiconductor package according to example embodiments may be a tape automated bonding (TAB) package. Accordingly, the wiring patterns 220a and 220b may be lead line patterns formed on the substrate 210. The substrate 210 may be a PCB substrate, a film substrate, a COF substrate, or a TCP substrate.

Figure 8:
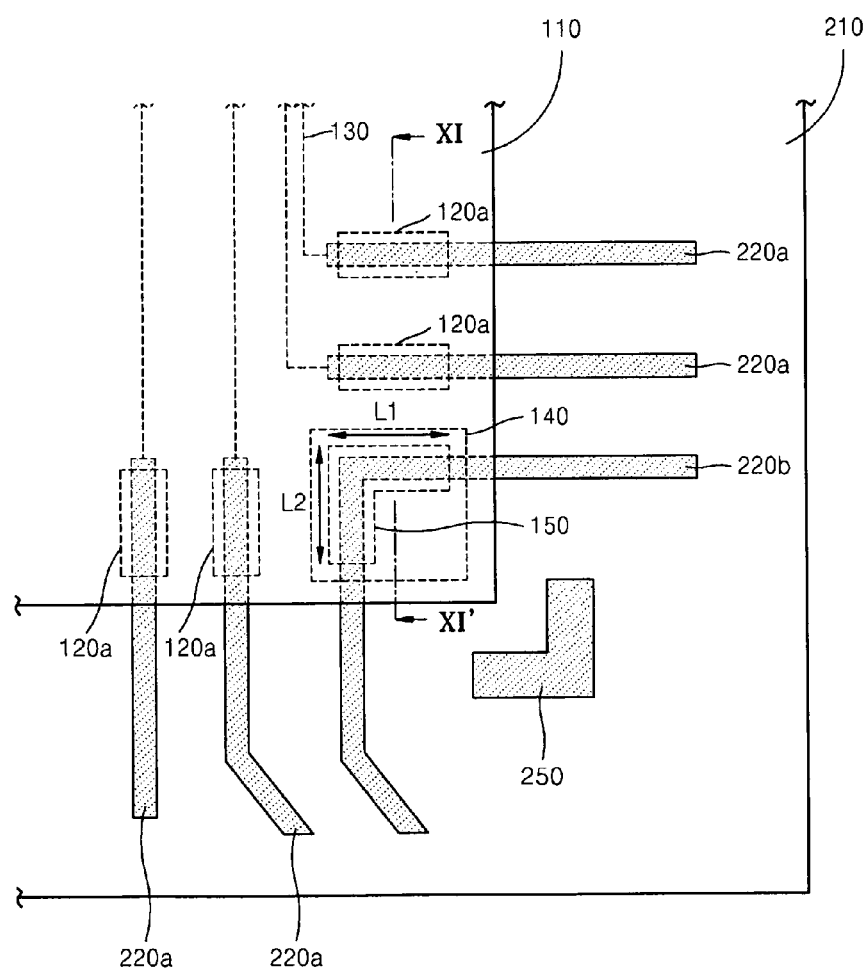
FIG. 8 is a plan view illustrating a semiconductor chip stacked on a substrate of a semiconductor package according to example embodiments.

FIG. 8 is a plan view illustrating a semiconductor chip stacked on a substrate of a semiconductor package according to example embodiments.

Referring to FIG. 8, the semiconductor chip 110 may be formed on the substrate 210 to provide a semiconductor package. The bumps 120a and the chip alignment mark 150 may be formed on a lower surface of the semiconductor chip 110. Accordingly, the bumps 120a and the chip alignment mark 150 may be illustrated with dotted lines.

Figure 11:
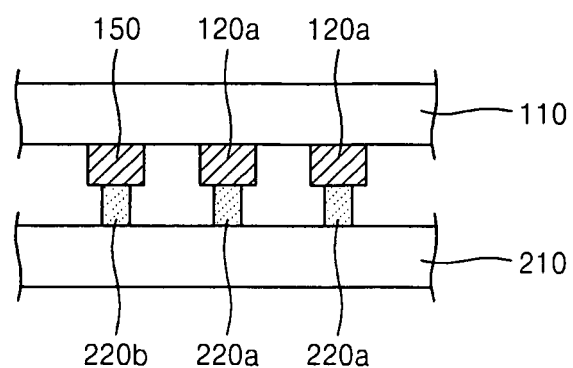
FIG. 11 is a cross-sectional view illustrating a cross-section of the semiconductor package of FIG. 8 cut along a line XI-XI'.

FIG. 11 is a cross-sectional view illustrating a cross-section of the semiconductor package of FIG. 8 cut along a line XI-XI'.

Referring to FIGS. 8 and 11, the bumps 120a may be formed on the lower surface of the semiconductor chip 110 and may be bonded to the wiring patterns 220a that may be formed on the upper surface of the substrate 210. The semiconductor chip 110 and the substrate 210 may be electrically connected to each other by bonding the bump 120a to the wiring patterns 220a. The chip alignment mark 150 may be bonded to the dummy wiring patterns 220b which may be formed on the upper surface of the substrate 210. The dummy wiring patterns 220b may not electrically connect the semiconductor chip 110 and the substrate 210 but may reinforce the connection between them.

Unlike in the conventional art, the chip alignment mark 150 illustrated in FIG. 8 may not be disposed between the bumps 120a and a center portion of the semiconductor chip 110, but instead may be disposed at an outer corner of the semiconductor chip 110. Thus, routing wirings 130 may extend from the bumps 120a and may be arranged regardless of the position of the chip alignment mark 150. Also, because the routing wiring 130 may be arranged without having to avoid the chip alignment mark 150, the length of the routing wirings 130 may be minimized or reduced. Accordingly, the wiring resistance may be minimized or reduced and the manufacturing costs of the semiconductor package may be reduced.

In order to precisely align the semiconductor chip 110 and the substrate 210, the semiconductor chip 110 may be arranged on the substrate 210 by matching up the chip alignment mark 150 formed on the semiconductor chip 110 with the substrate alignment mark 250 formed on the substrate 210. The alignment may be accomplished by measuring the positions of chip alignment mark 150 formed on the semiconductor chip 110 and the substrate alignment mark 250 formed on the substrate 210.

Figure 9:
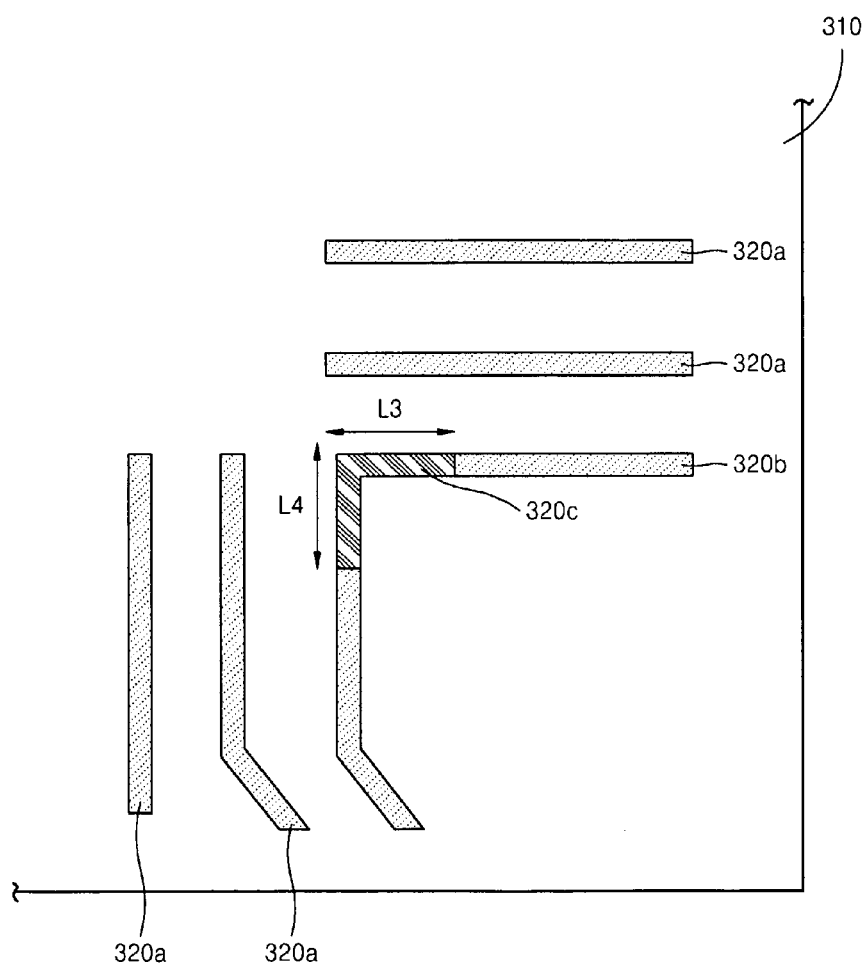
FIG. 9 is a plan view illustrating a portion of a substrate of a semiconductor package according to example embodiments.
Figure 10:
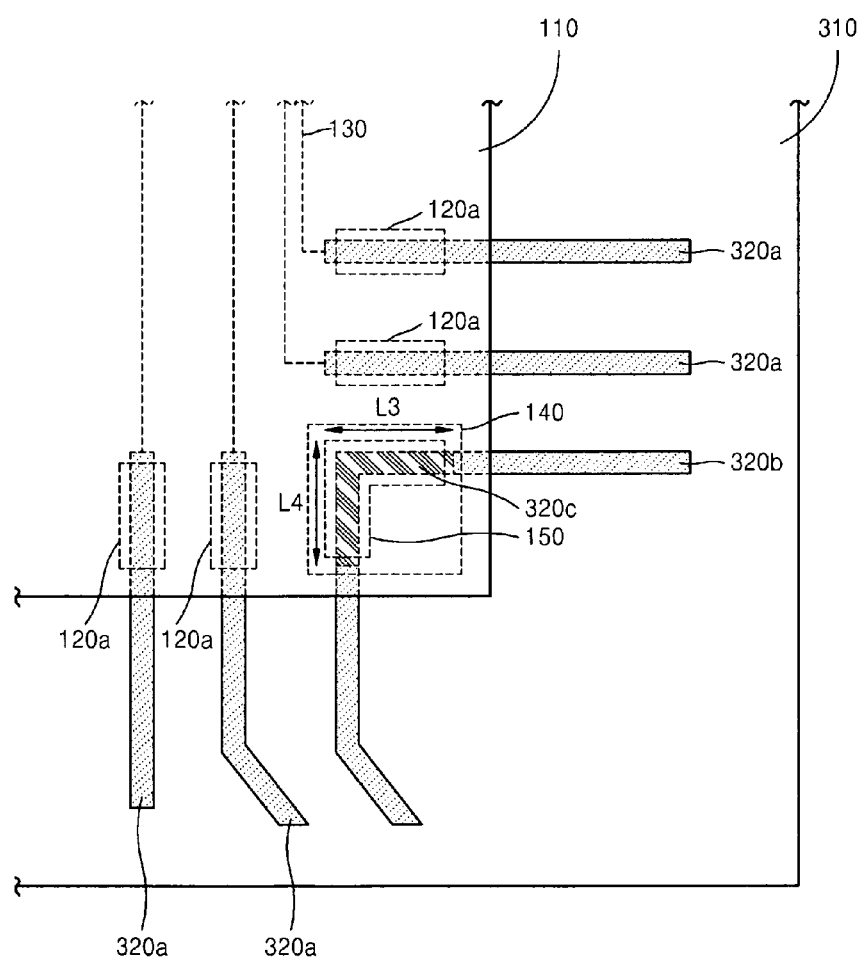
FIG. 10 is a plan view illustrating a semiconductor chip stacked on a substrate of a semiconductor package according to example embodiments.

FIG. 9 is a plan view illustrating a portion of a substrate of a semiconductor package according to example embodiments, and FIG. 10 is a plan view illustrating a semiconductor chip stacked on a substrate of a semiconductor package according to example embodiments.

A semiconductor chip 110 may be formed on a substrate 310, thereby forming a semiconductor package. Bumps 120a and a chip alignment mark 150 may be formed on a lower surface of the semiconductor chip 110. Accordingly, the bumps 120a and the chip alignment mark 150 are illustrated with dotted lines in FIG. 10. Like the chip alignment mark 150 illustrated in FIG. 8, the chip alignment mark 150 illustrated in FIG. 10 may be formed as two linear strips having one set of ends of perpendicular to one another and another set of ends are directed towards outer edges of the semiconductor chip 110. For example, the chip alignment mark 150 may include a first linear strip having a first length L3 and a second linear strip having a second length L4. As shown in FIG. 10, the proximal ends of the first and second linear strips are perpendicular to each other, and the distal ends of the first and second linear strips are directed towards outer edges of the semiconductor chip 110. Accordingly, the chip alignment mark 150 may be formed in an L-shape. Description of the semiconductor chip 110 is the same as that with reference to FIG. 5, and thus it will not be repeated.

Referring to FIGS. 9 and 10, a plurality of wiring patterns 320a and 320b may be formed on a surface of the substrate 310, for example, on an upper surface of the substrate 310. The wiring patterns 320a may electrically connect the substrate 310 to the semiconductor chip 110, and the wiring patterns 320b may be dummy wiring patterns which may not be related to the electrical connection.

The chip alignment mark 150 may be bonded to the dummy wiring patterns 320b, and thus, the dummy wiring patterns 320b may have a shape corresponding to the shape of the chip alignment mark 150. For example, when the chip alignment mark 150 is formed of two linear strips configured as an L-shape, the dummy wiring patterns 320b corresponding to the chip alignment mark 150 may also have an L-shape.

The semiconductor package according to example embodiments may preferably be a tape automated bonding (TAB) package. Accordingly, the wiring patterns 320a and 320b may be lead line patterns arranged on the substrate 310. The substrate 310 may be a PCB substrate, a film substrate, a chip on film (COF) substrate, or a tape carrier package (TCP) substrate.

According to example embodiments, a substrate alignment mark, like the substrate alignment mark 250 of FIG. 8, may be excluded from the upper surface of the substrate 310. That is, the substrate alignment mark 250 may be replaced with some of the dummy wiring patterns 320b. Accordingly, a portion of the dummy wiring patterns 320b that may be bonded to the chip alignment mark 150 may act as a substrate alignment mark 320c. When forming a substrate alignment mark using the dummy wiring patterns 320b, no substrate alignment mark is needed and thus, the surface area of the substrate 310 may be reduced.

According to example embodiments, the chip alignment mark and the wiring patterns may be bonded to each other by directly contacting each other or using an adhesive layer therebetween.

Figure 14:
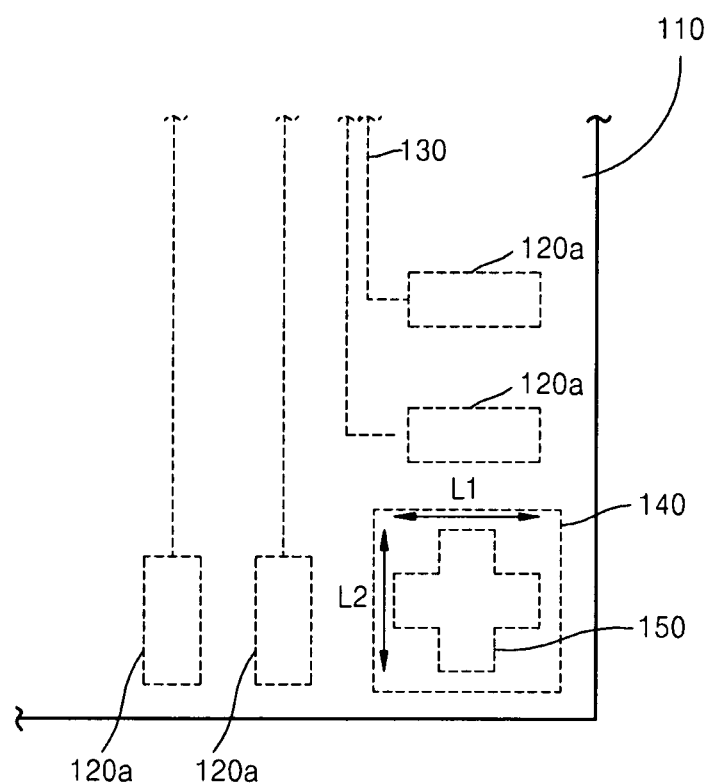
FIG. 14 illustrates a cross-shaped alignment mark system according to example embodiments.

Although the chip alignment mark 150 may have an L-shape formed of two linear strips, example embodiments are not limited thereto. For example, the chip alignment mark 150 may be formed of two linear strips which cross each other perpendicularly at their center portions, thereby forming a cross shape. FIG. 14 illustrates a cross-shaped alignment mark system according to example embodiments.

Figure 12:
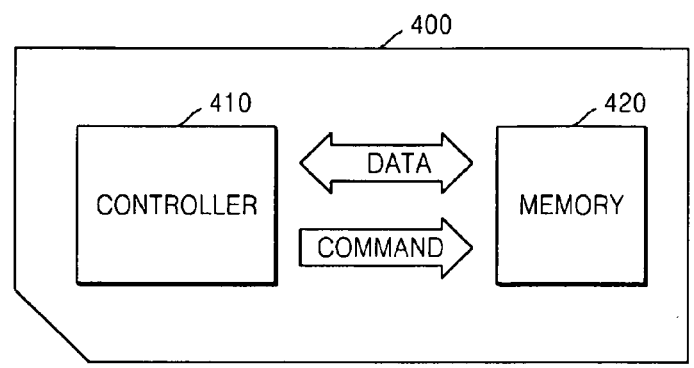
FIG. 12 is a schematic view of a card according to example embodiments.

FIG. 12 is a schematic view of a card 400 according to example embodiments. Referring to FIG. 12, a controller 410 and a memory 420 may be arranged to exchange electric signals. For example, according to a command of the controller 410, the memory 420 and the controller 410 may transmit or receive data to/from each other. Accordingly, the card 400 may store data to the memory 420 or output data from the memory 420. The memory 420 may include at least one of the semiconductor packages of FIGS. 5 through 11. The card 400 may be used in various mobile electric devices, for example, a multi media card (MMC) or a secure digital card (SD).

Figure 13:
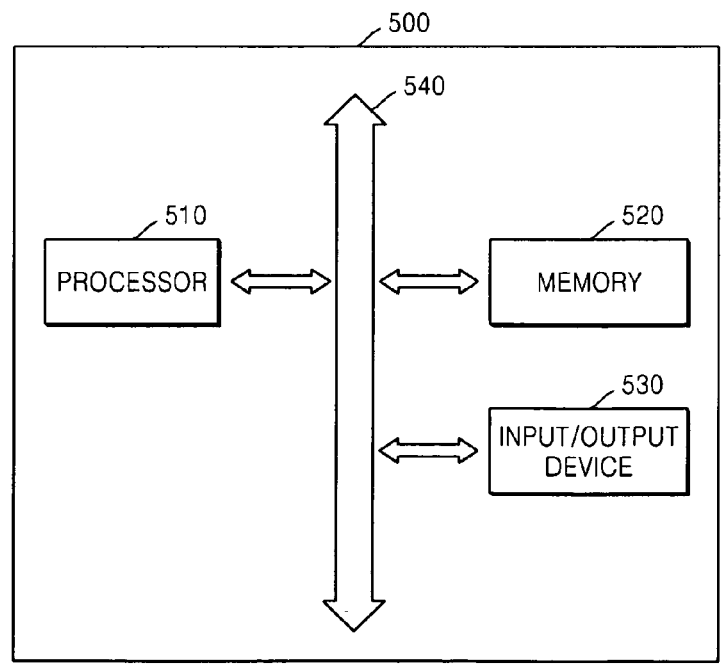
FIG. 13 is a block diagram illustrating a system according to example embodiments.

FIG. 13 is a block diagram illustrating a system 500 according to example embodiments. Referring to FIG. 13, a processor 510, an input/output device 530, and a memory 520 may transmit and receive data to/from one another using a bus 540. The processor 510 may execute a program and control the system 500. The input/output device 530 may be used to input or output data of the system 500. The system 500 may be connected to an external device, for example, a personal computer or a network, using the input/output device 530, and exchange data with the external device.

The memory 520 may store codes for the operation of the processor 510 and data. For example, the memory 520 may include at least one of the semiconductor packages of FIGS. 5 through 11. For example, the system 500 may be used in various mobile electronic devices, e.g., a mobile phone, an MP3 player, a navigation device, a solid state disk (SSD), or household appliances.

According to the semiconductor package of example embodiments, dummy bumps may be replaced with a chip alignment mark. Accordingly, routing wirings may be efficiently arranged, and the length of the routing wirings may be reduced. Consequently, circuit resistance may be reduced. Also, the surface area of the semiconductor chip may be reduced.

In addition, according to the semiconductor package of example embodiments, because the substrate alignment mark may be replaced with dummy wiring patterns, the surface area of the substrate may be reduced. Accordingly, the surface areas of the semiconductor chip and the substrate may be reduced, and thus a highly integrated semiconductor package may be manufactured.

While the inventive concept has been particularly shown and described with reference to example embodiments, it will be understood that various changes in form and details may be made therein without departing from the spirit and scope of the following claims.

What is claimed is:

1. A semiconductor package comprising:
    a substrate including a first substrate alignment mark on a surface of the substrate; and
    a semiconductor chip on the substrate including a chip alignment mark on a surface of the semiconductor chip to align the semiconductor chip with respect to the substrate by matching up with the substrate alignment mark,
    wherein the substrate includes electrically connecting wiring patterns and at least one dummy wiring pattern on a surface of the substrate, and the chip alignment mark is bonded to the at least one dummy wiring pattern,
    wherein the at least one dummy wiring pattern is not electrically connected to any of routing wirings of the semiconductor chip, and
    wherein the chip alignment mark has a first L-shape, the at least one dummy wiring pattern has a second L-shape, and the chip alignment mark and the least one dummy wiring pattern are arranged to overlap each other along an entire length of the chip alignment mark.

2. The semiconductor package of claim 1, wherein the semiconductor chip further includes a plurality of connection bumps each electrically connected to the corresponding routing wirings and the corresponding wiring patterns, the routing wirings are arranged to extend toward a center portion of the semiconductor chip, and the chip alignment mark is at an outer corner of the semiconductor chip.

3. The semiconductor package of claim 1, wherein the first L-shape includes two linear strips, wherein first ends of the two linear strips meet each other perpendicularly.

4. The semiconductor package of claim 3, wherein second ends of the two linear strips are directed towards two intersecting outer edges of the semiconductor chip, respectively.

5. The semiconductor package of claim 3, wherein the two linear strips are bonded to the at least one dummy wiring pattern.

6. The semiconductor package of claim 5, wherein the at least one dummy wiring pattern bonded to the two linear strips is configured to act as a second substrate alignment mark.

7. The semiconductor package of claim 1, wherein the semiconductor package is a tape automated bonding (TAB) package, and the wiring patterns are lead line patterns on the substrate.

8. The semiconductor package of claim 1, wherein the chip alignment mark and the at least one dummy wiring pattern are bonded to each other by one of directly contacting each other and using an adhesive layer therebetween.

9. The semiconductor package of claim 1, further including:
 at least one dummy bump connected to the at least one dummy wiring pattern and not connected to the routing wirings.

10. The semiconductor package of claim 1, further comprising:
 a plurality of bumps on the semiconductor chip along an circumference thereof,
 wherein the chip alignment mark is not between the plurality of bumps and a center portion of the semiconductor chip.

11. The semiconductor package of claim 1, further comprising:
 a plurality of bumps on the semiconductor chip, the plurality of bumps including a first set of bumps along a first side of the semiconductor chip and a second set of bumps along a second side of the semiconductor chip, the second side meeting the first side at substantially right angles,
 wherein the chip alignment mark is between the first set of bumps and the second set of bumps at a corner defined by the first side and the second side of the semiconductor chip.

12. The semiconductor package of claim 1, wherein the first substrate alignment mark is at a corner area defined by the at least one dummy wiring pattern having the second L-shape and two intersecting sides of the substrate.

13. A semiconductor package comprising:
 a substrate including a first substrate alignment mark on a surface of the substrate: and
 a semiconductor chip on the substrate including a chip alignment mark on a surface of the semiconductor chip to align the semiconductor chip with respect to the substrate by matching up with the first substrate alignment mark,
 wherein the substrate includes electrically connecting wiring patterns and at least one dummy wiring pattern on a surface of the substrate, and the chip alignment mark is bonded to the at least one dummy wiring pattern,
 wherein the semiconductor chip further includes a plurality of bumps on the surface of the semiconductor chip, and the wiring patterns on the substrate include a first plurality of lead line patterns on the surface of the substrate, the at least one dummy wiring pattern includes at least one second lead line pattern, and the chip alignment mark is bonded to the at least one second lead line pattern,
 wherein the at least one dummy wiring pattern is not electrically connected to any of routing wirings of the semiconductor chip, and
 wherein the chip alignment mark has a first L-shape, the at least one dummy wiring pattern has a second L-shape, and the chip alignment mark and the at least one dummy wiring pattern are arranged to overlap each other along an entire length of the chip alignment mark.

14. The semiconductor package of claim 13, wherein the plurality of the lead line patterns which are not bonded to the chip alignment mark are electrically connected to the corresponding plurality of the bumps, respectively.

15. The semiconductor package of claim 13, wherein the routing wirings are arranged to extend toward a center portion of the semiconductor chip, and
 the chip alignment mark is at an outer corner of the semiconductor chip.

16. The semiconductor package of claim 15, wherein the chip alignment mark includes two linear strips, wherein first ends of the two linear strips meet each other perpendicularly.

17. The semiconductor package of claim 16, wherein second ends of the two linear strips are directed towards two intersecting outer edges of the semiconductor chip, respectively.

18. The semiconductor package of claim 16, wherein the two linear strips are bonded to the at least one second lead line pattern.

19. The semiconductor package of claim 18, wherein the at least one second lead line pattern, to which the two linear strips are bonded, forms a second substrate alignment mark.

20. The semiconductor package of claim 13, wherein the chip alignment mark and the at least one dummy wiring pattern are bonded to each other by one of contacting each other and using an adhesive layer therebetween.

* * * * *